US012628488B1

(12) United States Patent

He et al.

(10) Patent No.: US 12,628,488 B1

(45) Date of Patent: May 12, 2026

(54) CHIP LAMP BEAD AND LUMINAIRE

(71) Applicant: SHANGYOU JIAYI LIGHTING PRODUCT CO., LTD., Ganzhou (CN)

(72) Inventors: Yaowen He, Ganzhou (CN); Fansheng Li, Ganzhou (CN)

(73) Assignee: SHANGYOU JIAYI LIGHTING PRODUCT CO., LTD., Ganzhou (CN)

( * ) Notice: Subject to any disclaimer, the term of this patent is extended or adjusted under 35 U.S.C. 154(b) by 0 days.

(21) Appl. No.: 19/058,282

(22) Filed: Feb. 20, 2025

(30) Foreign Application Priority Data

Nov. 14, 2024 (CN) .......................... 202411629631.X

(51) Int. Cl.
| | |
|---|---|
| *H10H 29/24* | (2026.01) |
| *H10H 20/85* | (2025.01) |
| *H10H 20/857* | (2025.01) |
| *H10H 29/01* | (2025.01) |
| *H10H 29/85* | (2025.01) |

(52) U.S. Cl.
CPC ........ *H10H 29/24* (2025.01); *H10H 20/8502* (2025.01); *H10H 20/857* (2025.01); *H10H 29/011* (2025.01); *H10H 29/857* (2025.01)

(58) Field of Classification Search
CPC .. H10H 29/24; H10H 20/8502; H10H 20/857; H10H 29/011; H10H 29/857
See application file for complete search history.

(56) References Cited

U.S. PATENT DOCUMENTS

| | | | |
|---|---|---|---|
| 2012/0300450 A1 | 11/2012 | Yamamoto | |
| 2014/0168037 A1* | 6/2014 | Sakariya | G09G 3/32 345/82 |
| 2017/0068362 A1* | 3/2017 | Den Boer | G09G 3/32 |
| 2017/0167703 A1* | 6/2017 | Cok | F21V 23/001 |
| 2022/0037571 A1* | 2/2022 | Lin | H10H 20/82 |
| 2022/0065431 A1 | 3/2022 | Schrank | |
| 2023/0005416 A1* | 1/2023 | Oh | G09G 5/10 |
| 2023/0420421 A1 | 12/2023 | Liu | |

OTHER PUBLICATIONS

Office Action from related EP25153274.3. 6 pages. Jul. 9, 2025.

* cited by examiner

*Primary Examiner* — Su C Kim

(74) *Attorney, Agent, or Firm* — FisherBroyles, LLP; Craig W. Mueller

(57) ABSTRACT

A chip lamp bead and a luminaire are provided. The chip lamp bead includes: a packaging body, and a lamp bead body packaged in the packaging body, where the lamp bead body includes a substrate, and a first luminous body, a second luminous body and a control chip provided on the substrate.

14 Claims, 2 Drawing Sheets

CHIP LAMP BEAD AND LUMINAIRE

This application claims the benefit of CN202411629631X, filed with the Chinese Intellectual Property Office on Nov. 14, 2024, and entitled "CHIP LAMP BEAD AND LUMINAIRE." the entire disclosures of which is incorporated by reference herein.

TECHNICAL FIELD

The present disclosure relates to the technical field of lamp beads, and particularly to a chip lamp bead and a luminaire.

BACKGROUND ART

Existing CHIP-type LED lamps mostly provide monochromatic light such as red, green, blue, warm white and white light, or multi-color light such as two-color and three-color light obtained by combining R, G, and B, and a lamp bead is packaged by compression-molding a monochromatic LED wafer with a transparent glue or a fluorescent glue. In a production process, an LED chip of each color needs to be separately packaged and then assembled, and position and connection of each chip also need to be precisely controlled, which makes the whole production process complicated, reduces production efficiency, and also increases production cost. There are shortcomings such as slow manufacturing, high cost, and complex production process for realizing simultaneous lighting of full color R, G, B, white light and warm white light in the same region.

Moreover, in the prior art, it is difficult to integrate multiple colors (R, G, and B) and white light of different color temperatures (cool white and warm white) into the same lamp bead, and it is impossible to realize an iridescence function of a lamp string with full color R, G, B, white light and warm white light (RGBW/RGBCW) in the same lamp.

SUMMARY

In view of this, the present disclosure aims at providing a chip lamp bead and a luminaire, which can realize an integrated single-lamp light source, of which a full color system and multiple color systems of a single lamp are simultaneously controlled and emit light.

In the first aspect, embodiments of the present disclosure provide a chip lamp bead, including: a packaging body and a lamp bead body packaged in the packaging body, where the lamp bead body includes a substrate, and a first luminous body, a second luminous body and a control chip provided on the substrate; the first luminous body and the second luminous body are respectively connected to corresponding control terminals of the control chip, where the first luminous body is a luminous body of a preset color system, and the second luminous body is a luminous body of a white light color system; and the control chip is configured to control, in response to a control signal, control the first luminous body and/or the second luminous body to light up based on the control signal.

In combination with the first aspect, embodiments of the present disclosure provide a first implementation of the first aspect, where the substrate includes a first substrate and a second substrate, the control chip is mounted on the first substrate through a preset die-bonding process, and the first luminous body and the second luminous body are mounted on the second substrate through the preset die-bonding process.

In combination with the first aspect, embodiments of the present disclosure provide a second implementation of the first aspect, where the control terminals of the control chip are provided towards the second substrate.

In combination with the first aspect, embodiments of the present disclosure provide a third implementation of the first aspect, where the second substrate includes an extending portion, the extending portion is away from the first substrate; and the first luminous body and the second luminous body are provided on a side close to the first substrate.

In combination with the first aspect, embodiments of the present disclosure provide a fourth implementation of the first aspect, where the first substrate includes a signal access end, and the control chip includes a signal pin, and the signal pin is connected to the signal access end.

In combination with the first aspect, embodiments of the present disclosure provide a fifth implementation of the first aspect, where the chip lamp bead further includes a luminous-body fixing structure; the substrate is mounted on one end surface of the luminous-body fixing structure; and the other end surface of the luminous-body fixing structure is provided with a first connection structure corresponding to the control chip, and a second connection structure corresponding to the first luminous body and the second luminous body.

In combination with the first aspect, embodiments of the present disclosure provide a sixth implementation of the first aspect, where the first luminous body includes at least one sub-luminous body, and the number of the sub-luminous bodies is corresponding to the number of single colors of the preset color system.

In combination with the first aspect, embodiments of the present disclosure provide a seventh implementation of the first aspect, where the second luminous body is a surface-mounted LED.

In combination with the first aspect, embodiments of the present disclosure provide an eighth implementation of the first aspect, where the control chip, the first luminous body and/or the second luminous body are mounted on the second substrate in a front-mounting (formal mounting) or flip-mounting (inverted mounting) manner.

In the second aspect, embodiments of the present disclosure provide a luminaire, where the luminaire is equipped with the chip lamp bead according to any one of the above implementations.

For the chip lamp bead and the luminaire provided in the embodiments of the present disclosure, the luminous body of white light and the luminous body of the preset color system are integrated in one lamp bead, different lamp beads can be uniformly controlled by the control chip, thus improving functionality and flexibility of an illumination system. The present disclosure not only can achieve abundant color effects and dynamic illumination effects, but also can improve energy efficiency. On the basis of white LEDs, by adjusting proportions of white LEDs (e.g. warm white and cool white) with different color temperatures, color temperature adjustment of the preset color system from a warm tone to a cool tone can also be realized, thus enhancing user experience and providing a variety of intelligent functions. Moreover, a color of monochromatic blue light is purer blue, a color of monochromatic white light or warm white light is more consistent, and a yield can be improved to 99% or higher.

Other features and advantages of the present disclosure will be illustrated in the following description, and part of them will be apparent from the description or learned by implementing the present disclosure. The objectives and other advantages of the present disclosure will be realized and attained by structures particularly pointed out in the description, claims and drawings.

In order to make the above objectives, features and advantages of the present disclosure more obvious and more understandable, detailed description is given below particularly with preferred embodiments in conjunction with accompanying drawings.

BRIEF DESCRIPTION OF DRAWINGS

In order to more clearly illustrate technical solutions in the embodiments of the present disclosure or the prior art, the drawings that need to be used in the description of the embodiments or the prior art will be briefly introduced below. Obviously, the drawings in the following description show some embodiments of the present disclosure. Those ordinarily skilled in the art still could obtain other drawings according to these drawings without using any inventive efforts.

Reference signs: 10—packaging body; 20—substrate; 11—control chip; 12—first luminous body; 13—second luminous body; 21—first substrate; 211—signal access terminal; 22—second substrate; 221—extending portion; 31—first connection structure; 32—second connection structure.

DETAILED DESCRIPTION OF EMBODIMENTS

In order to make objectives, technical solutions and advantages of the embodiments of the present disclosure clearer, the technical solutions in the present disclosure will be described clearly and completely below in conjunction with embodiments. Obviously, some but not all embodiments of the present disclosure are described. Based on the embodiments in the present disclosure, all of other embodiments obtained by those ordinarily skilled in the art without using any inventive efforts shall fall within the scope of protection of the present disclosure.

In order to solve the above technical problems, embodiments of the present disclosure provide a chip lamp bead and a luminaire, which can realize an integrated single-lamp light source, of which a full color system and multiple color systems of a single lamp are simultaneously controlled and emit light.

Figure 1:
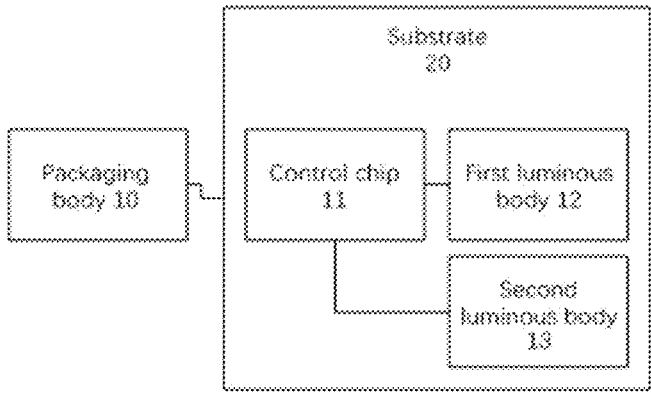
FIG. 1 is a structural schematic diagram of a chip lamp bead provided in embodiments of the present disclosure.

To facilitate understanding of the present embodiment, firstly, a chip lamp bead disclosed in embodiments of the present disclosure will be introduced in detail. FIG. 1 shows a structural schematic diagram of a chip lamp bead provided in embodiments of the present disclosure. As shown in FIG. 1, the chip lamp bead includes: a packaging body 10 and a lamp bead body packaged in the packaging body 10. In the above, the lamp bead body includes a substrate 20, and a first luminous body 12, a second luminous body 13 and a control chip 11 provided on the substrate 20. The packaging body 10 is a housing of the whole LED lamp bead, and is usually made from a transparent or semitransparent material, such as epoxy resin, silica gel or other transparent packaging materials. The packaging body 10 not only protects the luminous bodies and the control chip 11 therein, but also can provide optical properties such as light transmittance and scattering characteristics. In specific implementation, a packaging material can be injected onto the substrate 20 using a mold according to design requirements, so as to form a desired packaging shape. In the above, the first luminous body 12 is a luminous body of a preset color system, such as red, green or blue. Such LED chip will emit light of a specific wavelength when being energized. The second luminous body 13 is a luminous body of a white color system, such as white light or warm white light. The first luminous body 12 and the second luminous body 13 are respectively connected to corresponding control terminals of the control chip 11. The control chip 11 is configured to control, in response to a control signal, the first luminous body 12 and/or the second luminous body 13 to light up based on the control signal.

The substrate 20 is a base for supporting all elements, and a ceramic or aluminum substrate 20 having good thermal conductivity and electrical insulation is generally used. The substrate 20 is provided thereon with pads for fixing and connecting various elements. In the embodiments of the present disclosure, the luminous body (the first luminous body 12) of a preset color system and the luminous body (the second luminous body 13) of the white color system are designed, and these luminous bodies are independently controlled by one control chip 11. The control chip 11 is responsible for receiving external control signals and controlling operating states of the first luminous body 12 and the second luminous body 13 according to these signals. For example, if a control signal requires turning on red and white, the control chip 11 will activate corresponding output ports, so that red LED and white LED are simultaneously turned on. It should be noted that functions that can be realized by the control chip 11 include, but are not limited to: independent control: controlling on and off of the first luminous body 12 and the second luminous body 13, respectively; brightness adjustment: adjusting brightness of each luminous body through the PWM (pulse width modulation) technique; and color mixing: realizing mixing of multiple colors by controlling brightness proportions of different luminous bodies, so as to produce different color effects.

In conclusion, according to the chip lamp bead provided in the embodiments of the present disclosure, the white light and light of the preset color system are integrated in one lamp bead, and lamp beads of different color systems can be uniformly controlled by the control chip, thus improving functionality and flexibility of an illumination system. The present disclosure not only can achieve abundant color effects and dynamic illumination effects, but also can improve energy efficiency. On the basis of the white LED, by adjusting proportions of white LEDs (e.g. warm white and cool white) with different color temperatures, color temperature adjustment of the preset color system from a warm tone to a cool tone can also be realized, thus enhancing user experience and providing a variety of intelligent functions.

Figure 2:
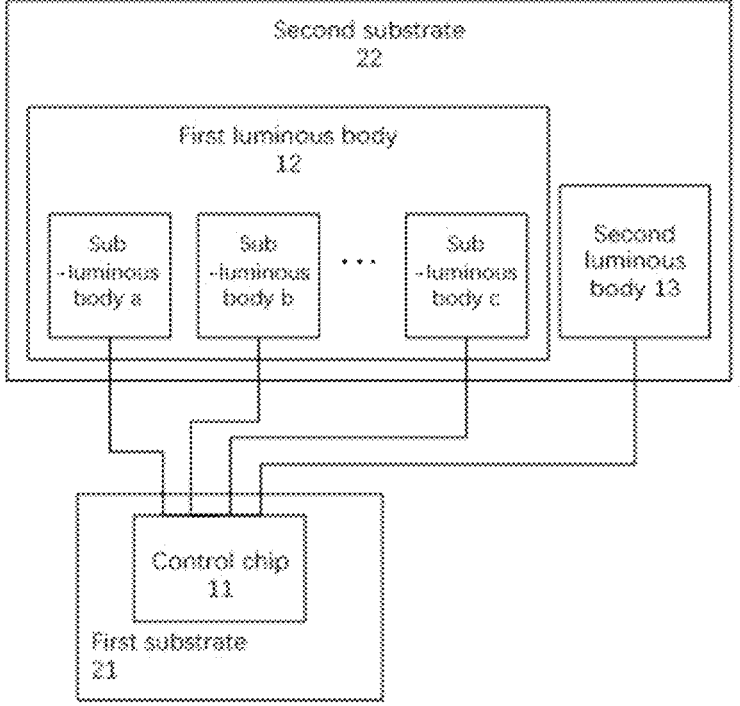
FIG. 2 is a structural schematic diagram of another chip lamp bead provided in embodiments of the present disclosure.

Further, based on the above embodiments, embodiments of the present disclosure further provide another chip lamp bead. FIG. 2 shows a structural schematic diagram of another chip lamp bead provided in the embodiments of the present disclosure. As shown in FIG. 2, the above substrate includes a first substrate 21 and a second substrate 22, the control chip is mounted on the first substrate 21 through a preset die-bonding process, and the first luminous body and the second luminous body are mounted on the second substrate 22 through the preset die-bonding process. Separate substrates are designed in the embodiments of the present disclosure for modularized design of the chip lamp bead, and the control chip and the luminous bodies are separately mounted on different substrates, so as to facilitate production and maintenance. Moreover, positions and sizes of the first substrate 21 and the second substrate 22 can also be adjusted according to practical requirements, so as to improve design flexibility.

In specific implementation, according to chip-type color-changing or point-control substrates with different functions, the first luminous body (lamp bead of a required color system) and the second luminous body (white light or warm white light) can be welded on corresponding substrate positions in a form of silver paste or solder paste welding. In the above, substrates made from a suitable material, such as an aluminum substrate or a ceramic substrate, can be selected. Pad positions set in advance on the substrate according to design requirements of LED lamp beads. Further, the first luminous body and the second luminous body are welded with the silver paste or solder paste. Silver paste: white light and colorful lamp beads are fixed at corresponding positions on the substrate using a conductive silver paste. The silver paste not only has good electrical conductivity, but also can provide a certain heat dissipation effect. Solder paste: the lamp bead is fixed on the substrate by means of reflow soldering with a lead-free solder paste, which is suitable for mass production, has a low cost and is highly reliable. For the control chip (such as a point-controlled IC), the point-controlled IC can be fixed at a designated position on the substrate with the conductive silver paste or solder paste.

Further, the control chip, the first luminous body and/or the second luminous body are mounted on the second substrate 22 in a front-mounting or flip-mounting manner. Front-mounting process: the LED chip (including white light and colorful lamp bead) is placed on the substrate with a front surface facing upwards. An electrode of the LED chip is connected to the pad on the substrate by a wire bonder with a gold wire or a copper wire. The point-controlled IC is placed on the substrate with a front surface facing upwards, and a pin of the IC is connected to the pad on the substrate with the gold wire or copper wire. Flip-mounting process: the LED chip is placed on the substrate with a back surface facing upwards, and an electrode of the chip is connected to the pad on the substrate directly through a projection welding technology. The point-controlled IC is placed on the substrate with a back surface facing upwards, and a pin of the IC is connected to the pad on the substrate through the projection welding technology. The flip-mounting process can reduce a length of a bonding line and improve heat dissipation performance and reliability. Further, the packaged LED lamp beads are cured in an oven, so as to ensure the packaging material to be completely hardened and tightly encapsulate the LED chip and the control chip. The control chip in the embodiments of the present disclosure can be a color-changing IC or a point-controlled IC, where the color-changing IC is configured to generate and control multiple colors and dynamic effects (such as gradual change and flashing), and the point-controlled IC is configured to accurately control brightness and color of each lamp bead, and is commonly used for pixel-level control.

In the above, the control terminals of the control chip in the embodiments of the present disclosure are provided towards the second substrate 22, which can reduce a length of a signal transmission path, simplify circuit wiring, and reduce signal delay and interference. The control chip is closer to the luminous bodies, and efficient integration can be performed in a small space, so that the whole lamp bead structure is more compact, thus facilitating integral packaging and installation, and facilitating miniaturized design.

Further, the second substrate 22 includes an extending portion 221, and the extending portion 221 is away from the first substrate 21; and the first luminous body and the second luminous body are provided on a side close to the first substrate 21. By designing the extending portion 221, the first luminous body and the second luminous body can be at a central position of the lamp bead, so that light can be more uniformly distributed, thus improving an illumination effect. The luminous bodies at the central position can reduce shadow caused by structure and provide more uniform illumination. In addition, the extending portion 221 can serve as an additional heat dissipation region to help dissipate heat and improve overall heat dissipation effect.

Further, the control chip includes a signal pin, and the signal pin is configured to output a control signal. The control chip can realize complex color-changing drive only with one signal input terminal, thus simplifying design of external connection, reducing the number of interfaces that need to be connected, and reducing complexity of system. In addition, the first substrate 21 includes a signal access end 211, and the signal pin of the control chip is directly connected to the signal access end 211 of the first substrate 21, thus simplifying circuit design, and improving signal transmission quality and integration of the system. Moreover, the control chip in the embodiments of the present disclosure is an independent module, and can be conveniently integrated into different systems. New functions can be added by updating firmware or software of the control chip without changing hardware design.

Figure 3:
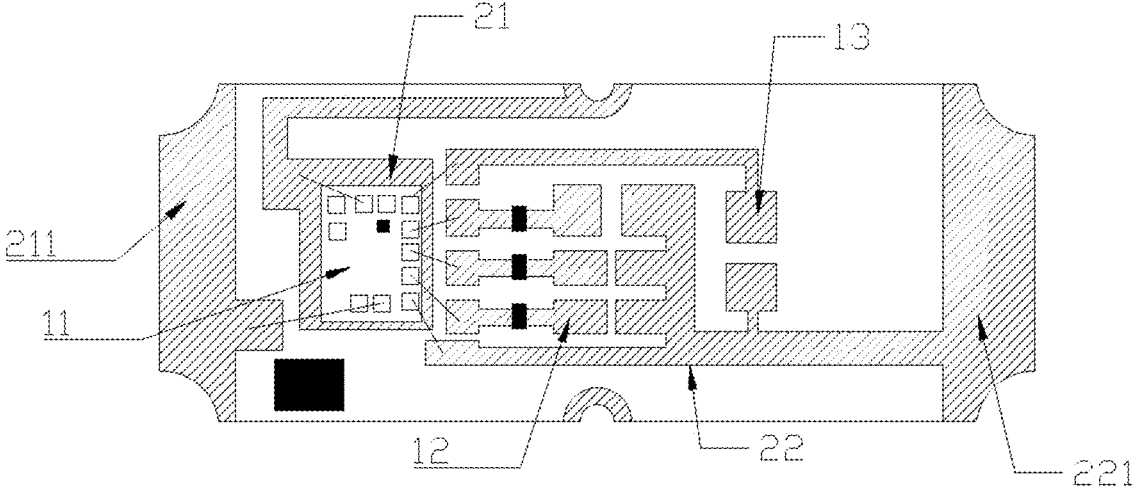
FIG. 3 is a structural diagram of a chip lamp bead provided in embodiments of the present disclosure.

Further, the first luminous body in the embodiments of the present disclosure includes at least one sub-luminous body, and the number of the sub-luminous bodies is corresponding to the number of single colors of preset color systems. In the above, the preset color systems include three color systems, i.e., RGB (red, green, and blue), three sub-luminous bodies can be provided, for example, each color system has one sub-luminous body, or other color systems and number of lamp beads, e.g., yellow (red+green), cyan (green+blue), and purple (red+blue), can selected as required. By combining different sub-luminous bodies, a plurality of colors and color tones are generated, thus realizing richer color expression. Each sub-luminous body is corresponding to a specific color, and high-precision color adjustment can be realized by accurately controlling brightness of various sub-luminous bodies. In the embodiments of the present disclosure, the sub-luminous bodies of the first luminous body are R, G, and B wafers, which are independent light-emitting regions corresponding to red, green and blue colors, respectively. Correspondingly, FIG. 3 shows a structural diagram of a chip lamp bead provided in the embodiments of the present disclosure. In FIG. 3, the first luminous body has three sub-luminous bodies arranged in parallel, which can be R, G, and B wafers sequentially from top to bottom in an embodiment. The second luminous body is located at a side end of the first luminous body, so that the whole lamp bead is compact in structure. In the above, FIG. 3 is a structural schematic diagram of the flip-mounted chip lamp bead, and a place of the first luminous body shown in FIG. 3 is mounting positions of the sub-luminous bodies (such as the above wafers) of the preset color systems, with white solder mask ink provided therebetween. A region where the first luminous body is located is a position on the second substrate, and the second substrate is connected to the extending portion. In FIG. 3, the extending portion is connected to a positive electrode of the lamp bead, the first substrate is connected to a negative electrode of the lamp bead, and the signal access terminal is an input terminal of the lamp bead. In addition, in FIG. 3, the first substrate is further provided with a mark on a lower side for identifying the negative electrode.

Further, in conjunction with FIG. 3, the second luminous body in the embodiments of the present disclosure is a surface-mounted LED, i.e., SMD LED (Surface-Mounted Device LED), where the LED is a chip-type lamp bead with a small size and a small volume, suitable for high-density installation, and particularly suitable for application in a limited space. In specific implementation, it can be of a type such as 0201 (with a size of 0.6 mm×0.3 mm) or 0402 (with a size of 1.0 mm×0.5 mm). The luminous body of the white color system includes white-like light: a color close to natural light, with a color temperature approximately between 4,000 K and 6,500 K; and warm white light: with a low color temperature, typically between 2,700 K and 3,500 K. In FIG. 3, the second luminous body is a warm white LED lamp bead.

In the prior art, a blue LED chip is usually used to excite yellow fluorescent powder, so as to convert part of blue light into yellow light. The blue light and the yellow light are mixed to form white light. Due to problems of conversion efficiency and color uniformity of the fluorescent powder, the generated white light may not be pure enough, and deviation of color temperature, non-uniformity of color or other cases may occur. In the embodiments of the present disclosure, a white light LED or a warm white light LED is packaged into a chip-type lamp bead with a small size, so as to realize white light or warm white light. In the embodiments of the present disclosure, the control chip is directly used to drive the luminous body of the white light system (such as a white light LED wafer), instead of converting fluorescent powder, the white light directly generated is purer, and has a more stable color temperature, and the yield can be improved to 99% or higher. The problem of non-uniform color that may appear in the process of converting the fluorescent powder is avoided. Moreover, loss of energy in the process of converting the fluorescent powder can also be reduced, thus improving overall luminous efficiency. Further, as each luminous body is independently controlled by the control chip, not only the color of the monochromatic white light or the warm white light is more consistent, but also the color of monochromatic blue light is purer blue, and light of other color systems is in the same case, so that a lamp string and a decorative product can realize a four-channel or five-channel iridescence function for a single lamp with full color R, G, B, white light and warm white light (RGBW/RGBCW). Dynamic effects, such as flashing, gradual change, and breathing light, can also be achieved by programming the control chip. The present disclosure is applicable to various application scenarios, such as stage lighting, intelligent household, and decorative lighting.

Figure 4:
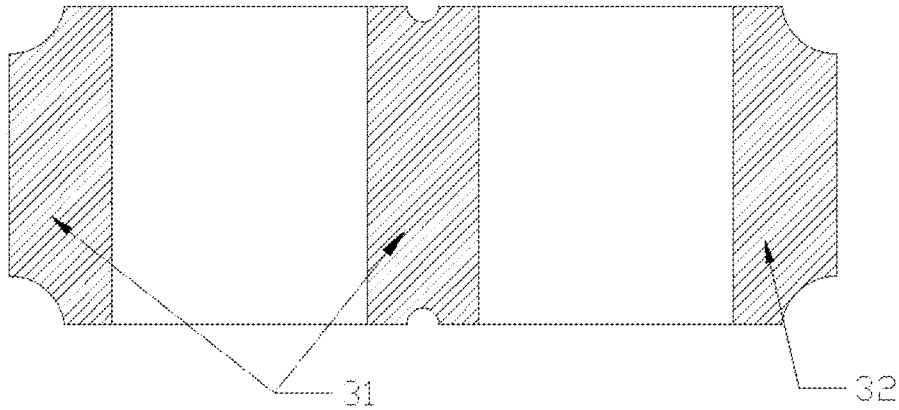
FIG. 4 is a rear schematic diagram of the chip lamp bead corresponding to FIG. 3.

Further, the chip lamp bead further includes a luminous-body fixing structure; the substrate is mounted on one end surface of the luminous-body fixing structure; the other end surface of the luminous-body fixing structure is provided with a first connection structure 31 corresponding to the control chip, and a second connection structure 32 corresponding to the first luminous body and the second luminous body. FIG. 4 shows a rear schematic diagram of the chip lamp bead. Taking FIG. 4 as an example, the luminous-body fixing structure is a patch structure, and connection structures on the other end surface thereof include an input terminal, a negative electrode and a positive electrode, where the input terminal and the negative electrode are at positions corresponding to the first substrate 21, and the positive electrode is at a position corresponding to the second substrate 22. Between the connection structures, a green strip made from copper foil or other conductive materials is provided, and a green solder mask is coated, so as to prevent short circuit and corrosion. These conductive paths ensure that current can be smoothly transmitted from the input terminal to the negative electrode and the positive electrode, so as to drive operation of the luminous body (e.g., LED).

Further, based on the above embodiments, embodiments of the present disclosure further provide a luminaire, where the luminaire is provided with the chip lamp bead according to any one of the above embodiments. The above chip lamp bead can be widely applied in various luminaires, from household lighting to professional equipment. In an embodiment, the luminaire can be a high-end lighting device for indoor lighting, such as ceiling lamps, wall lamps, and table lamps; for commercial lighting: lighting systems for shopping malls, hotels, offices and like places; for industrial lighting, such as lighting for factories, warehouses etc. that require high brightness and stability. It can also be applied to display devices, such as LCD/LED displays for televisions, computer displays, mobile phone screens, etc.; OLED displays: high-end display devices, such as professional displays and smart watches. Alternatively, it can also be applied to medical equipment, such as operating lamps and therapeutic lamps, and to scientific research instruments such as fluorescent microscopes and spectrometers. It should be noted that implementation principles and technical effects of the luminaire provided in the embodiments of the present disclosure are the same as those of the chip lamp bead in the preceding embodiments of. For brevity, for parts that are not mentioned in the embodiments of the luminaire, reference can be made to corresponding contents of the chip lamp bead in the preceding embodiments.

Finally, it should be noted that the above embodiments are merely specific embodiments of the present disclosure, for illustrating the technical solutions of the present disclosure, rather than limiting the present disclosure, and the scope of protection of the present disclosure should not be limited thereto. While the detailed description is made to the present disclosure with reference to the preceding embodiments, those ordinarily skilled in the art should understand that within the technical scope disclosed in the present disclosure, any skilled person familiar with the present technical field still could make modifications or readily envisage changes to the technical solutions disclosed in the preceding embodiments, or make equivalent substitutions to some of the technical features therein. These modifications, changes or substitutions do not make the essence of corresponding technical solutions depart from the spirit and scope of the technical solutions of the embodiments of the present disclosure, and they all should be covered within the scope of protection of the present disclosure. Therefore, the scope of protection of the present disclosure should be based on the scope of protection of the claims.

What is claimed is:

1. A chip lamp bead, comprising: a packaging body and a lamp bead body packaged in the packaging body,
wherein the lamp bead body comprises a substrate, and a first luminous body, a second luminous body and a control chip provided on the substrate;

the first luminous body and the second luminous body are respectively connected to corresponding control terminals of the control chip, wherein the first luminous body is a luminous body of a preset color system, and the second luminous body is a luminous body of a white light color system;

the control chip is configured to control, in response to a control signal, control the first luminous body and/or the second luminous body to light up based on the control signal;

wherein the substrate comprises a first substrate and a second substrate, wherein the control chip is mounted on the first substrate through a preset die-bonding process, and the first luminous body and the second luminous body are mounted on the second substrate through the preset die-bonding process;

wherein the chip lamp bead further comprises a luminous-body fixing structure, wherein the substrate is mounted on one end surface of the luminous-body fixing structure;

wherein another end surface of the luminous-body fixing structure is provided with a first connection structure corresponding to the control chip, and a second connection structure corresponding to the first luminous body and the second luminous body; and wherein the luminous-body fixing structure is a patch structure, and the first and second connection structures on the other end surface thereof include an input terminal, a negative electrode and a positive electrode, where the input terminal and the negative electrode are at positions corresponding to the first substrate, and the positive electrode is at a position corresponding to the second substrate, a green strip made from copper foil or other conductive materials is provided between the connection structures, and a green solder mask is coated on the green strip.

2. The chip lamp bead according to claim 1, wherein control terminals of the control chip are provided towards the second substrate.

3. The chip lamp bead according to claim 1, wherein the second substrate comprises an extending portion away from the first substrate; and the first luminous body and the second luminous body are provided on a side close to the first substrate.

4. The chip lamp bead according to claim 1, wherein the first substrate comprises a signal access end, and the control chip comprises a signal pin connected to the signal access end.

5. The chip lamp bead according to claim 1, wherein the first luminous body comprises at least one sub-luminous body, and the number of the sub-luminous bodies is corresponding to the number of single colors of the preset color system.

6. The chip lamp bead according to claim 1, wherein the second luminous body is a surface-mounted LED.

7. The chip lamp bead according to claim 1, wherein the control chip, the first luminous body and/or the second luminous body are mounted on the second substrate in a front-mounting or flip-mounting manner.

8. A luminaire, equipped with the chip lamp bead according to claim 1.

9. The luminaire according to claim 8, wherein the control terminals of the control chip are provided towards the second substrate.

10. The luminaire according to claim 8, wherein the second substrate comprises an extending portion away from the first substrate; and the first luminous body and the second luminous body are provided on a side close to the first substrate.

11. The luminaire according to claim 8, wherein the first substrate comprises a signal access end, and the control chip comprises a signal pin connected to the signal access end.

12. The luminaire according to claim 8, wherein the first luminous body comprises at least one sub-luminous body, and the number of the sub-luminous bodies is corresponding to the number of single colors of the preset color system.

13. The luminaire according to claim 8, wherein the second luminous body is a surface-mounted LED.

14. The luminaire according to claim 8, wherein the control chip, the first luminous body and/or the second luminous body are mounted on the second substrate in a front-mounting or flip-mounting manner.

* * * * *